United States Patent
Doglio et al.

(10) Patent No.: US 11,227,575 B2
(45) Date of Patent: Jan. 18, 2022

(54) AERODYNAMIC ACOUSTIC RESONATOR TO DISSIPATE ENERGY FROM AIR MOVERS

(71) Applicant: DELL PRODUCTS, L.P., Round Rock, TX (US)

(72) Inventors: Jean M. Doglio, Round Rock, TX (US); Evangelos Koutsavdis, Austin, TX (US)

(73) Assignee: Dell Products, L.P., Round Rock, TX (US)

( * ) Notice: Subject to any disclaimer, the term of this patent is extended or adjusted under 35 U.S.C. 154(b) by 708 days.

(21) Appl. No.: 16/100,301

(22) Filed: Aug. 10, 2018

(65) Prior Publication Data
US 2020/0051540 A1    Feb. 13, 2020

(51) Int. Cl.
*G10K 11/172* (2006.01)
*H05K 7/20* (2006.01)

(52) U.S. Cl.
CPC ....... *G10K 11/172* (2013.01); *H05K 7/20736* (2013.01)

(58) Field of Classification Search
CPC .......................... G10K 11/172; H05K 7/20736
USPC ............................... 181/201, 214, 229
See application file for complete search history.

(56) References Cited

U.S. PATENT DOCUMENTS

| | | | |
|---|---|---|---|
| 2,017,043 A * | 10/1935 | Galliot | F02M 1/00 138/40 |
| 3,120,876 A * | 2/1964 | Lirette | F04D 29/664 181/229 |
| 4,300,656 A * | 11/1981 | Burcham | B64D 33/02 181/214 |
| 5,526,228 A | 6/1996 | Dickson et al. | |
| 6,646,876 B2 | 11/2003 | Carr et al. | |
| 6,896,095 B2 * | 5/2005 | Shah | F01P 5/06 181/198 |
| 7,033,137 B2 | 4/2006 | Shufeldt | |
| 7,891,464 B2 * | 2/2011 | Tang | F04D 25/08 181/225 |
| 7,986,526 B1 | 7/2011 | Howard et al. | |
| 8,155,332 B2 | 4/2012 | Gross et al. | |
| 8,261,530 B2 * | 9/2012 | Hendricks | F02C 7/04 60/226.1 |
| 9,875,773 B1 | 1/2018 | Waters et al. | |
| 2005/0194206 A1 * | 9/2005 | Rose | G10K 11/178 181/224 |
| 2008/0186668 A1 | 8/2008 | Naufel et al. | |
| 2015/0125268 A1 * | 5/2015 | Koopmann | B64C 11/001 415/119 |
| 2018/0090181 A1 | 3/2018 | Paterra et al. | |
| 2018/0102124 A1 | 4/2018 | Huo et al. | |

(Continued)

*Primary Examiner* — Forrest M Phillips
(74) *Attorney, Agent, or Firm* — Isidore PLLC

(57) ABSTRACT

An air-cooled enclosure of an information handling system has a chassis that receives at least one heat-generating functional component. An air mover is positioned within the chassis to move air within the chassis to convectively cool the at least one heat-generating functional component. An acoustic resonator includes a resonator body having a cavity sized to resonate at an acoustic frequency corresponding to a selected acoustic noise frequency, such as blade passage frequency, associated with the fan. The resonator body has an opening to the cavity that is directed toward and positioned a distance from the fan to receive and attenuate acoustic noise.

20 Claims, 10 Drawing Sheets

(56) References Cited

U.S. PATENT DOCUMENTS

2019/0024675 A1\*  1/2019  Chen ................. F04D 25/08
2019/0254191 A1\*  8/2019  Chang ............... H05K 7/20736

\* cited by examiner

AERODYNAMIC ACOUSTIC RESONATOR TO DISSIPATE ENERGY FROM AIR MOVERS

BACKGROUND

1. Technical Field

The present disclosure relates in general to air cooling in an information handling system (IHS), and more particularly to a method and system for internally dissipating acoustic energy of air movers within an IHS.

2. Description of the Related Art

As the value and use of information continue to increase, individuals and businesses seek additional ways to process and store information. One option available to users is information handling systems (IHSs). An IHS generally processes, compiles, stores, and/or communicates information or data for business, personal, or other purposes, thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

New generations of enterprise IHSs have higher computing density and thus have a corresponding increase in cooling requirements for heat-generating functional components such as central processing units (CPUs). To meet the higher cooling requirements, higher velocity air cooling is provided, using fans at much higher speeds than for conventional cooling. Current server fan technology reaches extreme fan speeds, inducing hard disk drives (HDDs) throughput failure from acoustics and vibration transmitted to the HDDs. In some conventional applications, sufficient mitigation of aeroacoustic disturbance to throughput by the HDDs was provided by increasing the distance between fans and HDDs or adding acoustic foams. This solution is no longer effective in some instances for the high-frequency disturbances coming from high-performance fans. The amount of distance required to sufficiently attenuate the higher level and frequency of noise cannot be allocated within the chassis without substantially reducing room for functional components. As HDDs increase in storage capacity and transfer speeds, the problem is projected to get worse with an expected ten-fold increase in HDD sensitivity to acoustics over the next 10 years.

BRIEF SUMMARY

In accordance with the teachings of the present disclosure, an air-cooled enclosure includes a chassis that receives at least one heat-generating functional component of an information handling system (IHS). A fan is positioned within the chassis to move air through the chassis to convectively cool the at least one heat-generating functional component. An acoustic resonator includes a resonator body having a cavity sized to resonate at an acoustic frequency corresponding to a selected acoustic noise frequency associated with the fan such as blade passage frequency (BPF). An opening to the cavity is directed toward and positioned a distance from the fan to receive and attenuate acoustic noise.

In accordance with the teachings of the present disclosure, an IHS includes at least one heat-generating functional component and an air-cooled enclosure having a chassis that receives the at least one heat-generating functional component. The air-cooled enclosure includes a fan positioned within the chassis to move air through the chassis to convectively cool the at least one heat-generating functional component. An acoustic resonator includes a resonator body having a cavity sized to resonate at an acoustic frequency corresponding to a selected acoustic noise frequency associated with the fan such as BPF. An opening to the cavity is directed toward and positioned a distance from the fan within the chassis to receive and attenuate acoustic noise.

In accordance with the teachings of the present disclosure, a method includes providing an acoustic resonator comprising a resonator body having a cavity sized to resonate at an acoustic frequency corresponding to a selected acoustic noise frequency of a fan. The method includes receiving at least one heat-generating functional component of an information handling system within a chassis. The method includes positioning the fan within the chassis to move air within the chassis to convectively cool the at least one heat-generating functional component. The method includes aligning with and spacing away an opening to the cavity of the acoustic resonator from a face of the fan to respectively receive and attenuate acoustic noise and to allow air flow to pass around the resonator body to the face of fan.

The above presents a general summary of several aspects of the disclosure to provide a basic understanding of at least some aspects of the disclosure. The above summary contains simplifications, generalizations and omissions of detail and is not intended as a comprehensive description of the claimed subject matter but, rather, is intended to provide a brief overview of some of the functionality associated therewith. The summary is not intended to delineate the scope of the claims, and the summary merely presents some concepts of the disclosure in a general form as a prelude to the more detailed description that follows. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

Figure 1:
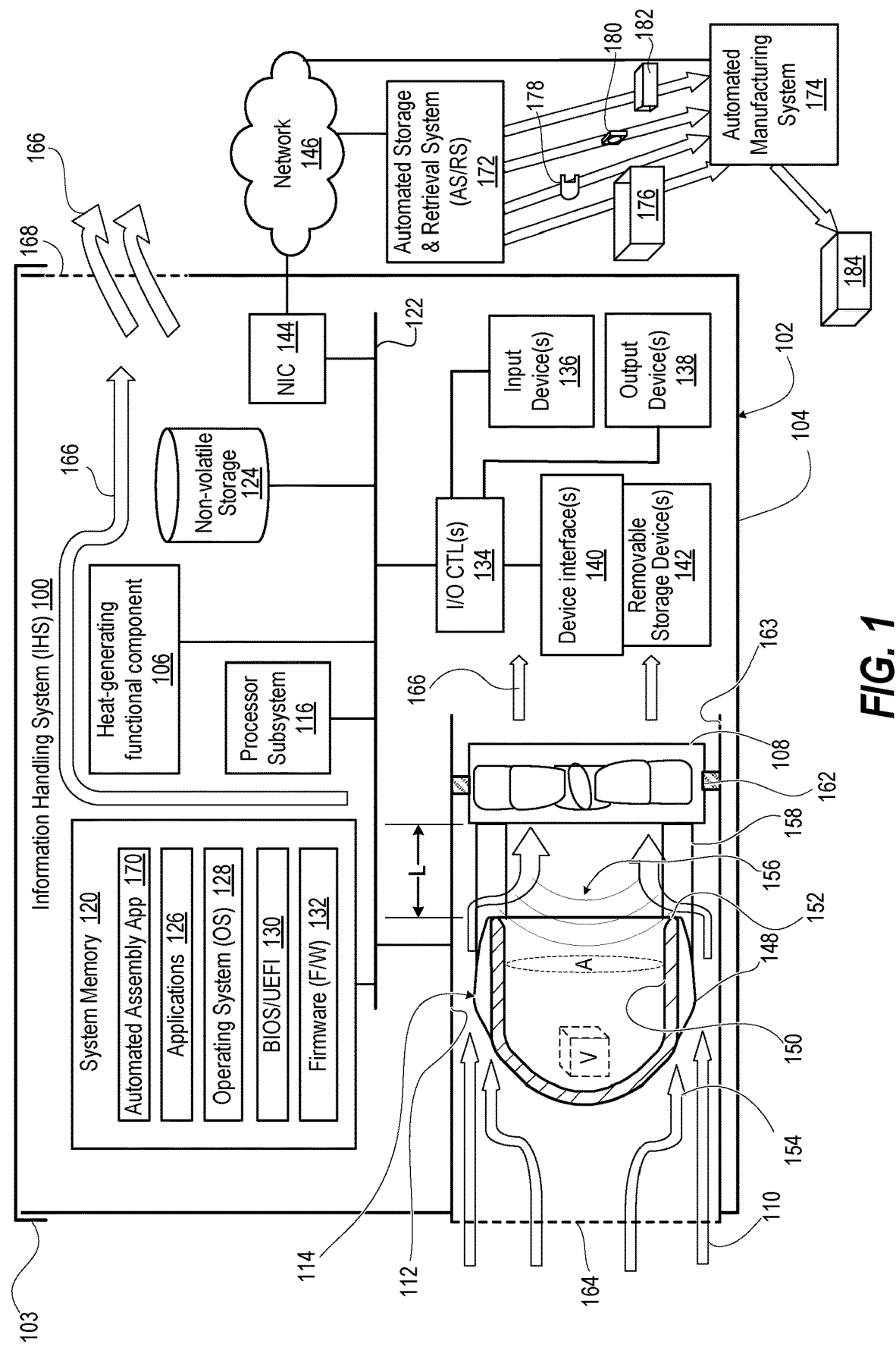
FIG. 1 is block diagram representation illustrating an example information handling system (IHS) having an example acoustic resonator mounted on a fan module to reduce aeroacoustic energy delivered to heat-generated functional components, according to one or more embodiments.

According to aspects of the present disclosure, an air-cooled enclosure, an information handling system (IHS), and a method of automated manufacturing and assembly provide high speed air cooling with improved internal aeroacoustic benefits. The air-cooled enclosure of the IHS has a chassis that receives at least one heat-generating functional component. A fan is positioned within the chassis to move air within the chassis to convectively cool the at least one heat-generating functional component. The at least one heat-generating functional component is susceptible to aeroacoustics from the fan, which can cause throughput performance errors or degradation of component reliability. Aeroacoustics is a branch of acoustics that studies noise generation via either turbulent fluid motion or aerodynamic forces interacting with surfaces. In mitigation of aeroacoustics of the fan, the disclosure provides an acoustic resonator located within the chassis. The resonator incudes a resonator body having a cavity that is sized to resonate at an acoustic frequency corresponding to a selected acoustic noise frequency associated with the fan, such as BPF. The resonator body has an opening to the cavity that is directed toward and positioned a distance from the fan to receive and dampen acoustic noise within the cavity.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

FIG. 1 illustrates a block diagram representation of example information handling system (IHS) 100 having air-cooled enclosure 102, which includes cover 103 and chassis 104 that receives at least one heat-generating functional component 106. One or more air movers, such as fan modules 108, are positioned within chassis 104 to move cooling air flow 110 through chassis 104 to convectively cool at least one heat-generating functional component 106. Air duct 112 is provided within chassis 104 and is positioned to direct cooling air flow 110 between one or more fan modules 108 and at least one heat-generating functional component 106. In one or more embodiments, an acoustic resonator 114 is provided on an upstream side of fan module 108. Acoustic resonator 114 acts as a passive noise reduction mechanism within air duct 112 to protect at least one heat-generating functional component 106.

Within the general context of IHSs, IHS 100 may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an IHS may be a personal computer, a PDA, a consumer electronic device, a network storage device, or any other suitable device and may vary in size, shape, performance, functionality, and price. IHS 100 may include random access memory (RAM), one or more processing resources such as a central processing unit (CPU) or hardware or software control logic, ROM, and/or other types of nonvolatile memory. Additional components of IHS 100 may include one or more disk drives, one or more network ports for communicating with external devices as well as various input and output (I/O) devices, such as a keyboard, a mouse, and a video display. IHS 100 may also include one or more buses operable to transmit communications between the various hardware components.

Referring again to FIG. 1, processor subsystem 116 is coupled to system memory 120 and other heat-generating functional components 106 via system interconnect 122. System interconnect 122 can be interchangeably referred to as a system bus, in one or more embodiments. Also coupled to system interconnect 122 is non-volatile storage, e.g., a non-volatile random-access memory (NVRAM) storage 124, within which can be stored one or more software and/or firmware modules and one or more sets of data that can be utilized during operations of IHS 100. These one or more software and/or firmware modules can be loaded into system memory 120 during operation of IHS 100. Specifically, in one embodiment, system memory 120 can include therein a plurality of such modules, including one or more of applications 126, operating system (OS) 128, basic input/output system (BIOS) or Uniform Extensible Firmware Interface (UEFI) 130, and firmware (F/W) 132. These software and/or firmware modules have varying functionality when their corresponding program code is executed by processor subsystem 116 or secondary processing devices within IHS 100. For example, application(s) 126 may include a word processing application, a presentation application, and a management station application, among other applications.

IHS 100 further includes one or more input/output (I/O) controllers 134 which support connection by and processing of signals from one or more connected input device/s 136, such as a keyboard, mouse, touch screen, or microphone. I/O controllers 134 also support connection to and forwarding of output signals to one or more connected output devices 138, such as a monitor or display device or audio speaker(s). Additionally, in one or more embodiments, one or more device interfaces 140, such as an optical reader, a USB, a card reader, Personal Computer Memory Card International Association (PCMCIA) slot, and/or a high-definition multimedia interface (HDMI), can be associated with IHS 100. Device interface(s) 140 can be utilized to enable data to be read from or stored to corresponding removable storage device(s) 142, such as a compact disk (CD), digital video disk (DVD), flash drive, or flash memory card. In one or more embodiments, device interface(s) 140 can further include general purpose I/O interfaces such as inter-integrated circuit ($I^2C$), system management bus (SMB), and peripheral component interconnect (PCI) buses.

IHS 100 comprises a network interface controller (NIC) 144. NIC 144 enables IHS 100 and/or components within IHS 100 to communicate and/or interface with other devices, services, and components that are located external to IHS 100. These devices, services, and components can interface with IHS 100 via an external network, such as example network 146, using one or more communication protocols that can include transport control protocol/internet protocol (TCP/IP) and network block device (NBD) protocol. Network 146 can be a local area network, wide area network, personal area network, and the like, and the connection to and/or between network and IHS 100 can be wired, wireless, or a combination thereof. For purposes of discussion, network 146 is indicated as a single collective component for simplicity. However, it should be appreciated that network 146 can comprise one or more direct connections to other devices as well as a more complex set of interconnections as can exist within a wide area network, such as the Internet.

Acoustic resonator 114 includes a passive noise suppression mechanism that is based on the principle of resonance and can be augmented using resistive materials. Acoustic resonator 114 includes a resonator body 148 having a cavity 150 with a volume "V" sized to resonate at an acoustic frequency corresponding to a selected acoustic noise frequency of fan module 108. The acoustic noise frequency can be deterministically found based on number of fan blades and expected operating speed of a fan blade. The acoustic noise frequency can be empirically found based on operating one or more fans at one or more fan speeds. Cavity 150 has an opening 152 directed toward and positioned a distance from fan module 108 to receive acoustic noise. Cavity 150 has a transverse area "A", which is related to resonance frequency as described below.

Figure 2:
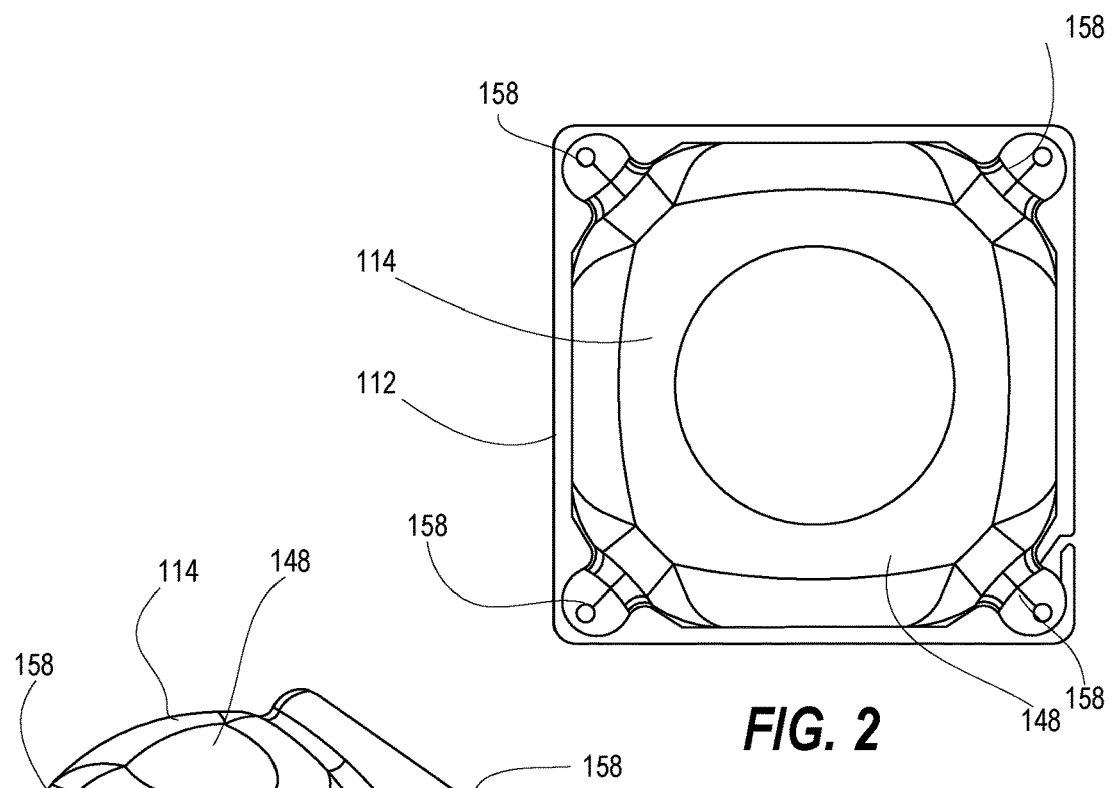
FIG. 2 is a front view of the example acoustic resonator in an air duct, according to one or more embodiments.

FIG. 2 is a front view of the example acoustic resonator 114 in air duct 112. FIGS. 1-2 illustrate that air duct 112 is sized to allow air flow 154 around acoustic resonator 114, according to one or more embodiments. FIG. 1 illustrates that acoustic resonator 114 is received within air duct 112 upstream of fan module 108. Acoustic resonator 114 blocks most of the cross-sectional area in front of fan module 108 so that a substantial portion of aeroacoustic energy 156 is received within expansive opening 152 that is coextensive with a transverse area of cavity 150. Acoustic resonator 114 is spaced far enough away from interior walls of air duct 112 to avoid significantly restricting the airflow or prevent creation of acoustic resonances. Acoustic response and airflow performance can be tuned by altering distance.

Figure 3:
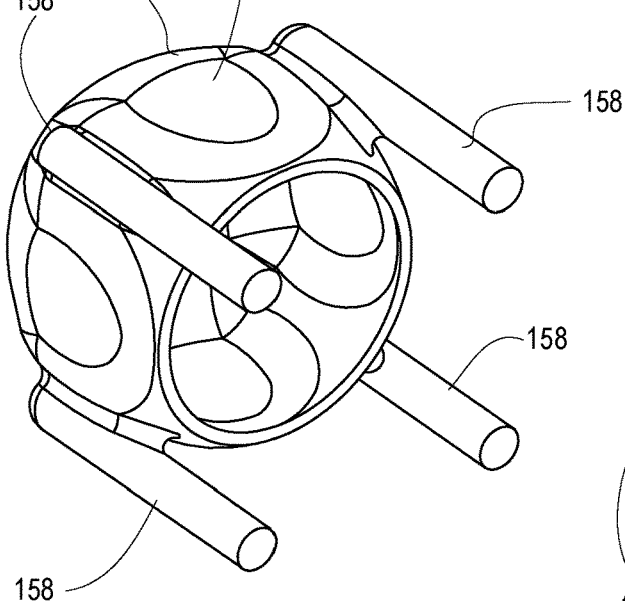
FIG. 3 is a rear isometric view of the acoustic resonator, according to one or more embodiments.
Figure 4:
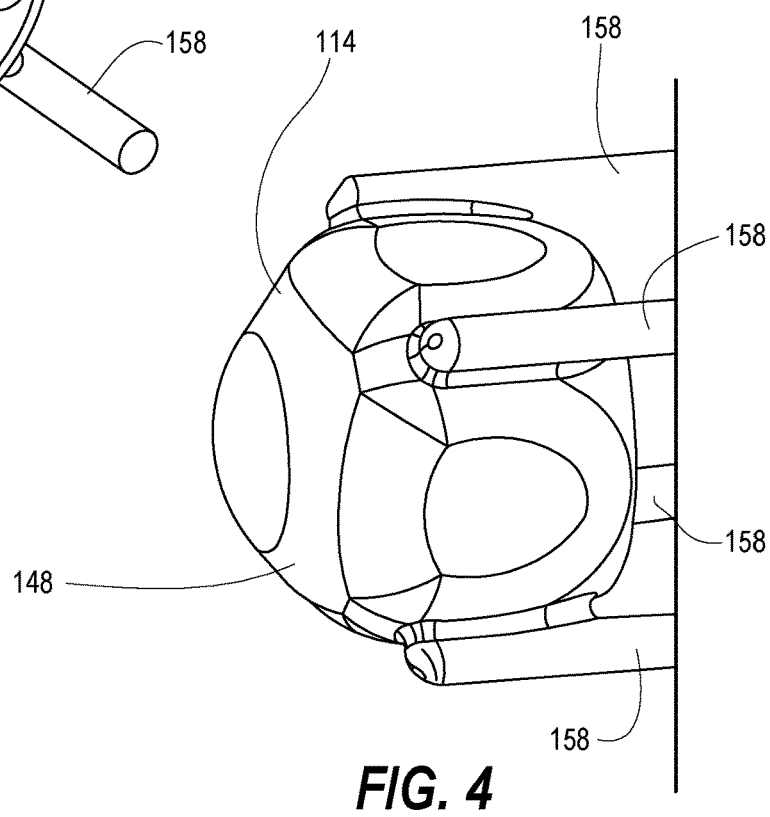
FIG. 4 is a side isometric view of the acoustic resonator, according to one or more embodiments.

FIG. 3 is a rear isometric view of the acoustic resonator 114. FIG. 4 is a side isometric view of the acoustic resonator 114, FIGS. 1-4 illustrate that support structures such as four legs 158 extend from resonator body 148. With continued reference to FIG. 1, legs 158 are attachable to an upstream face 160 of fan module 108 such as a fan module or fan gantry, providing the spacing L. In the illustrated embodiment, fan module 108 is supported within air duct 112 by thermal seal 162. In one or more embodiments, acoustic resonator 114 can be attached to air duct 112 or to chassis 104 instead of to fan module 108. Resonator body 148 can include resistive material such as foam on the inside or outside surfaces, or adjacent to resonator body 148 in chassis 104. Air duct 112 has a terminal opening 163 positioned proximate to at least one heat-generating functional component 106 to enable convective air cooling of at least one heat-generating functional component 106. In one embodiment, acoustic resonator 114 is closer to an inlet 164 of chassis 104 than fan module 108. Cooling air 166 is pushed by fan module 108 out of air duct 112 to convectively cool heat-generating functional components 106 and then exits air-cooled enclosure 102 through an exhaust port 168.

The underlying principle is similar to and improves upon the well-known Helmholtz resonator (HR). Conceptually, a HR is comprised of a spherical cavity having a volume "V" which is connected to the acoustic system using a tube of length "L" and cross-sectional area "A". The diameter of the tube is substantially smaller than the diameter of the spherical cavity. In its most fundamental form, the resonance frequency ($f_R$) is proportional to the square root of the opening area and inversely proportional to the square roots of the cavity volume and length of the tube. The resonant frequency, $f_R$, is defined by the follow equation:

$$f_R = \frac{c}{2\pi}\sqrt{\frac{A}{VL}} \qquad (\text{Eqn. 1})$$

wherein "c" is the speed of sound.

Acoustic resonator 114 only loosely resembles the conceptual HR, but simulation has established that acoustic resonator 114 behaves like an HR. For example, reducing the internal volume V and/or reducing the distance "L" of acoustic resonator 114 from the fan gantry or fan module 108 increases the resonance frequency as expected. Acoustic resonator 114 can be fine-tuned and can support potentially adding active tuning if space, cost and conditions allow. Generally-known HRs only address a specific resonance frequency at which maximum transmission loss (TL) occurs. The present innovation contemplates and provides for tuning acoustic resonator 114 so that the resonant frequency is as close as possible to the blade pass frequency of fan module 108 for high-speed operation. In addition, according to one aspect of the disclosure, the TL curve can be broadened and raised at frequencies different than the resonant frequency with the use of resistive materials such as foam. Having a broader response can be useful for providing attenuation across a wider range of aeroacoustic noise possibilities.

The area of the traditional "tube" of an HR is opened substantially to collect as much aeroacoustic energy 156 as possible coming from fan module 108. In one or more embodiments, fan module 108 is oriented in the opposite direction, pulling cooling air past heat-generating functional components 106. In this orientation, acoustic resonator 114 is positioned or located between fan module 108 and heat-generating functional components 106. Thus, acoustic resonator 114 blocks the "acoustical line of sight" between fan module 108 and heat-generating functional components 106. In one or more embodiments, fan module 108 is between heat-generating functional components 106. Positioning central processing units (CPUs) of processing subsystem 116 upstream of fan module 108 pulls cooling air past CPUs, where the cooling air is not warmed by other heat-generating functional components 106. CPUs generally require more cooling. Heat-generating components 106, such as HDDs, can be positioned downstream of fan module 108. Cooling air warmed by CPUs is still sufficiently cool for cooling HDDs. Heat-generating functional components 106, either upstream or downstream, can be sensitive to acoustical disturbances and benefit from noise attenuation provided by acoustic resonator 114.

With specific reference to FIG. 1, IHS 100 can include an automated assembly application 170 in memory 120 that can calculate a design for an acoustic resonator 114 having resonance frequency that is appropriate for a particular cooling system. Automated assembly program 170, when executed by processor subsystem 116, can enable IHS 100 to communicate via NIC 144 and network 146 to an automated storage and retrieval system (AS/RS) 172 and automated manufacturing system 174. AS/RS 172 retrieves components including chassis 176, acoustic resonator 178, fan module 180, and air duct 182 that are assembled by automated manufacturing system 174 into another IHS 184. Automated manufacturing system 174 can include capabilities to fabricate customized acoustic resonators 178, such as via three-dimensional printing.

Figure 5:
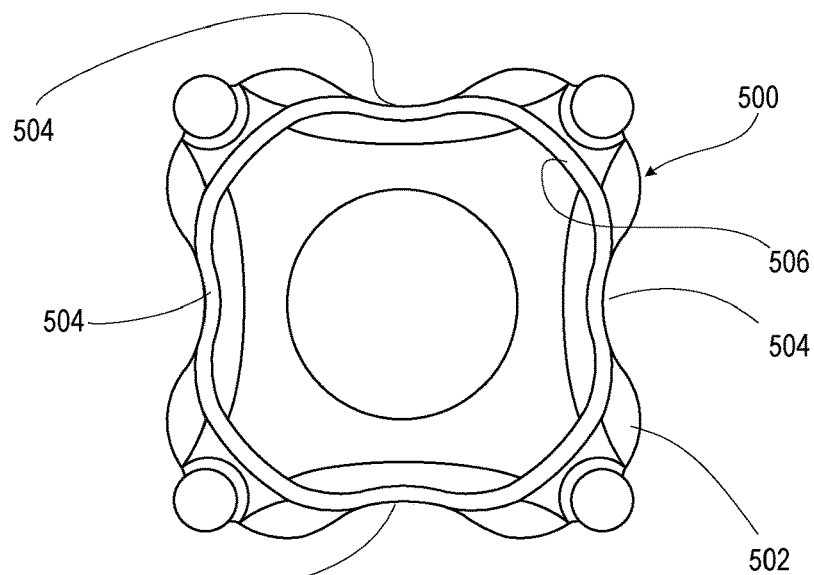
FIG. 5 is a rear view of an example acoustic resonator having grooved sides for increased airflow, according to one or more embodiments.

FIG. 5 illustrates a rear view of an example acoustic resonator 500 having resonator body 502 with four longitudinal grooves 504 that increase air flow between resonator body 502 and an inner surface of air duct 112 (FIG. 1). Fine tuning of airflow performance can be achieved with this additional spacing without significant impact to frequency characteristics of cavity 506.

Figure 6:
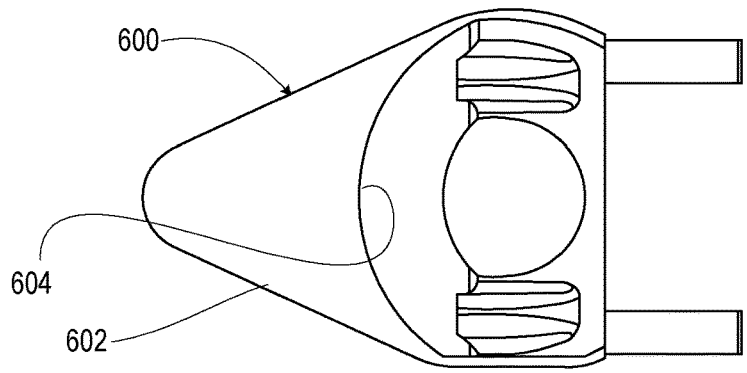
FIG. 6 is side cutaway view of an example acoustic resonator having an elongate aerodynamic shape with retained cavity shaping, according to one or more embodiments.

FIG. 6 illustrates an acoustic resonator 600 having a resonator body 602 with an elongate outside shape that improves air separation yet retains a more rounded interior shaped cavity 604 to maintain a selected volume, and thus resonant frequency.

Figure 7:
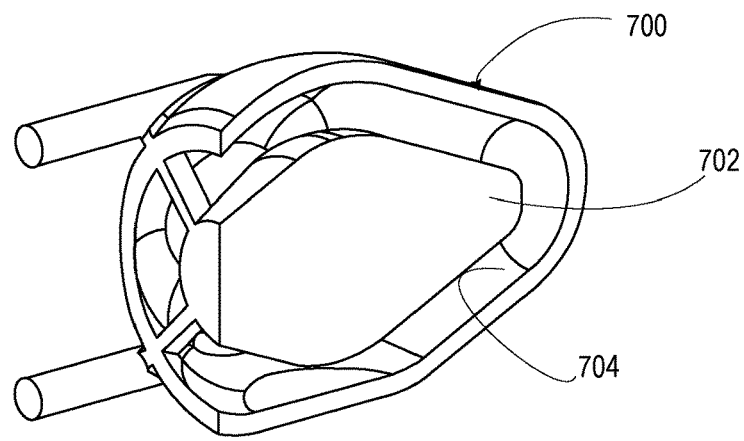
FIG. 7 is a side cutaway view of an example acoustic resonator having a central insert to reduce volume of a cavity, according to one or more embodiments.

FIG. 7 illustrates an acoustic resonator 600 having a central insert 702 that reduces the volume of cavity 704 while keeping an elongate profile. Central insert 702 is shaped and attached inside cavity 704 such that aeroacoustic energy or vibrations are directed between central insert 702 and an interior surface of cavity 704 to affect a resonate frequency of cavity 704.

Figure 8:
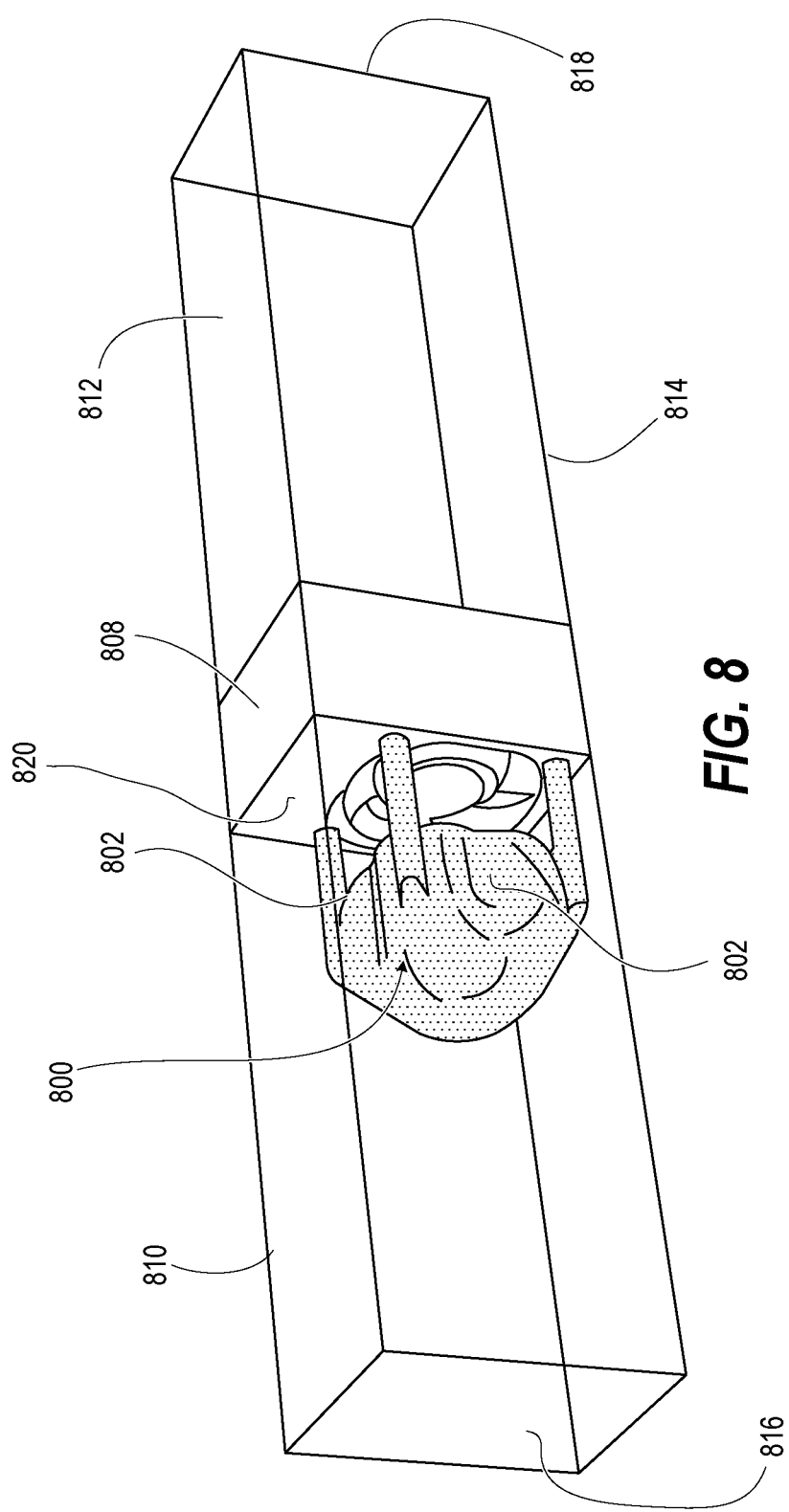
FIG. 8 is a side isometric view of an air duct containing a grooved acoustic resonator mounted on a fan module, according to one or more embodiments.

FIG. 8 is an isometric representation of acoustic resonator 800 having grooved sides 802 and aerodynamically shaped resonator body 806 that is mounted to a fan module 808 within a rectangular air duct 810. The outside of acoustic resonator 800 is shaped aerodynamically such that the airflow is minimally disturbed/blocked as the air passes around acoustic resonator 800 and moves to the fan. Performance of acoustic resonator 800 as assembled has been simulated with computational fluid dynamics (CFD) and acoustic finite element analysis (FEA) software, with good results. For air flow simulation, top and bottom walls 812, 814 of air duct 810 are walls without foam with an inlet 816 providing air to acoustic resonator 800 for exhausting at an outlet 818. For acoustic analysis, inlet 816 is modeled as a non-reflecting boundary. A near face 820 of fan module 808 defines a plane used as a source of excitation for the acoustic simulation. Foam on upper and lower walls 812, 814 was simulated as an option. The geometry of acoustic resonator 800 is used in simulations, according to the present disclosure, to simulate aerodynamic losses from acoustic resonator 800.

Figure 9:
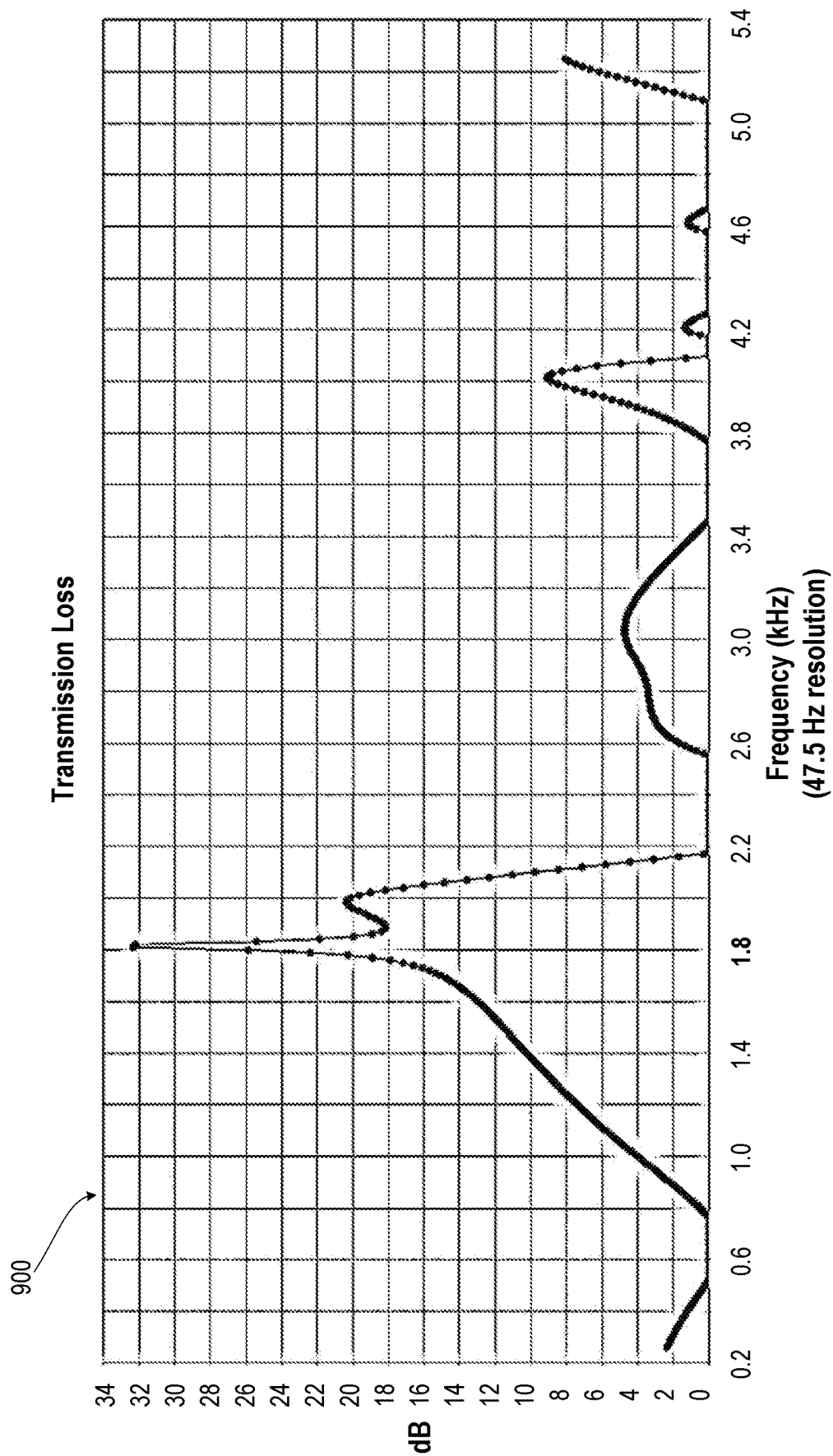
FIG. 9 is graphical plot illustrating simulated acoustic performance for the assembled air duct, acoustic resonator and fan module, according to one or more embodiments.
Figure 10:
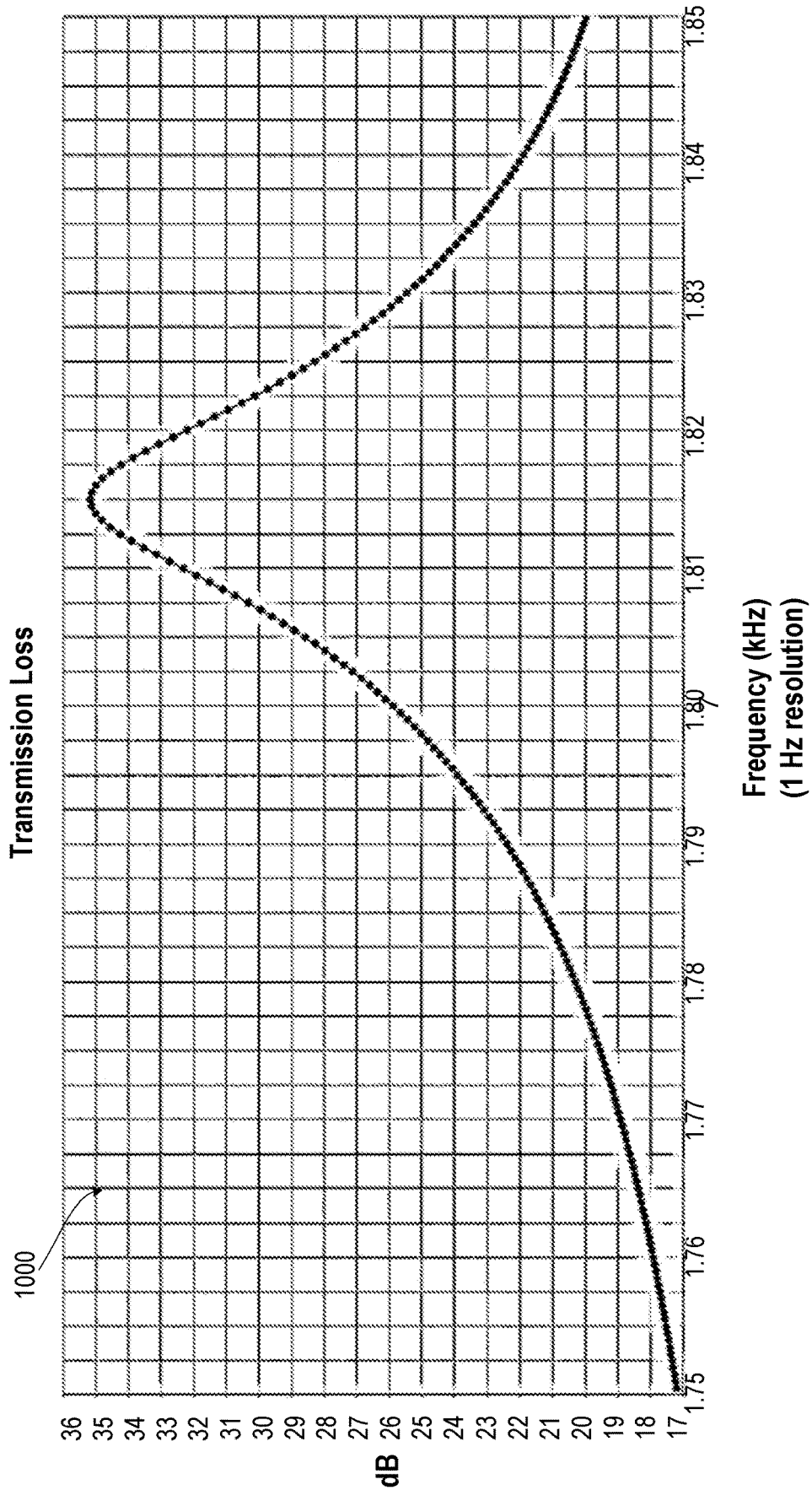
FIG. 10 is a detail view of the graphical plot of FIG. 9, according to one or more embodiments.
Figure 11:
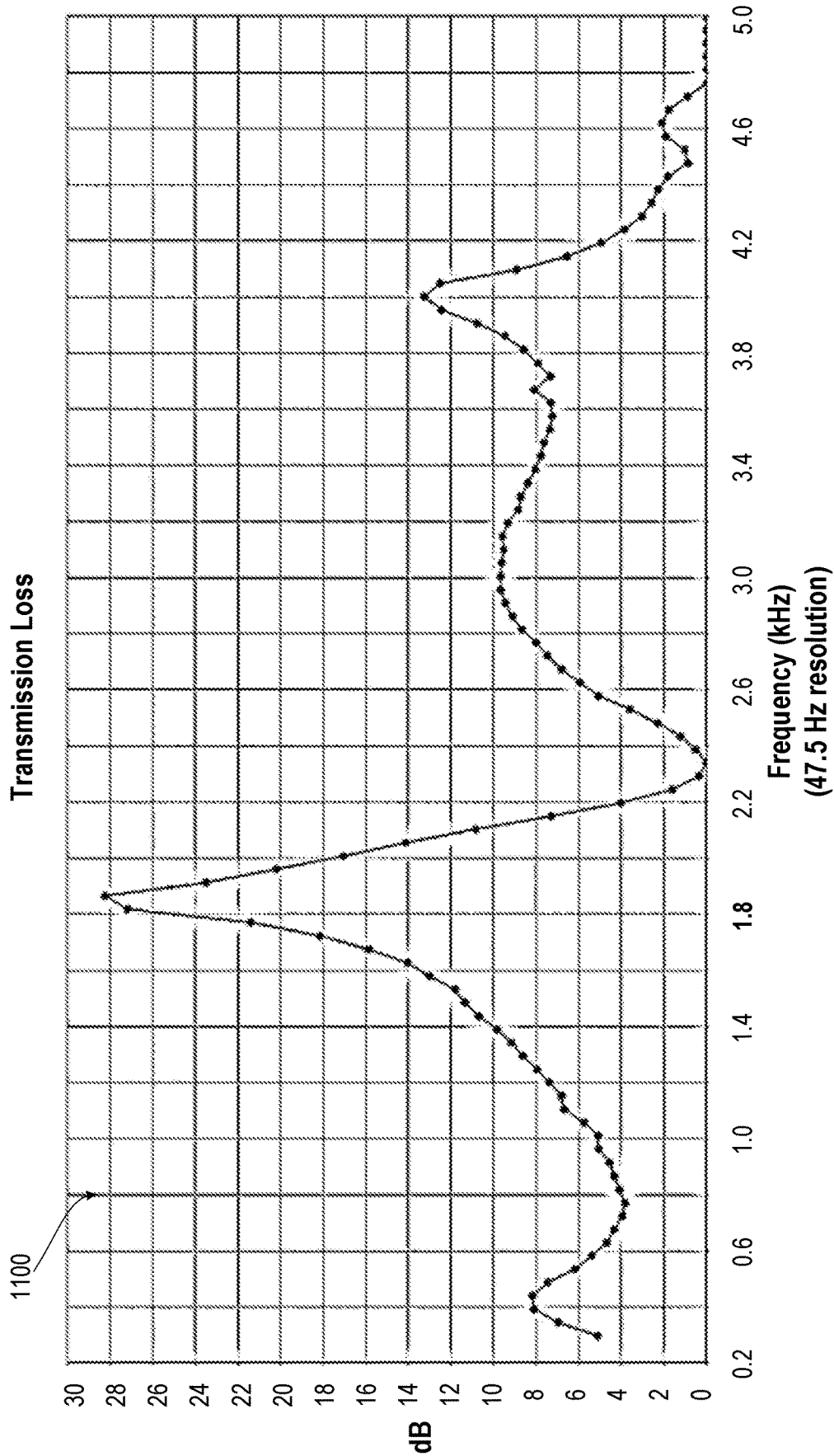
FIG. 11 is graphical plot illustrating simulated acoustic performance for the assembled air duct, acoustic resonator and fan module of FIG. 8 with acoustic foam added, according to one or more embodiments.
Figure 12:
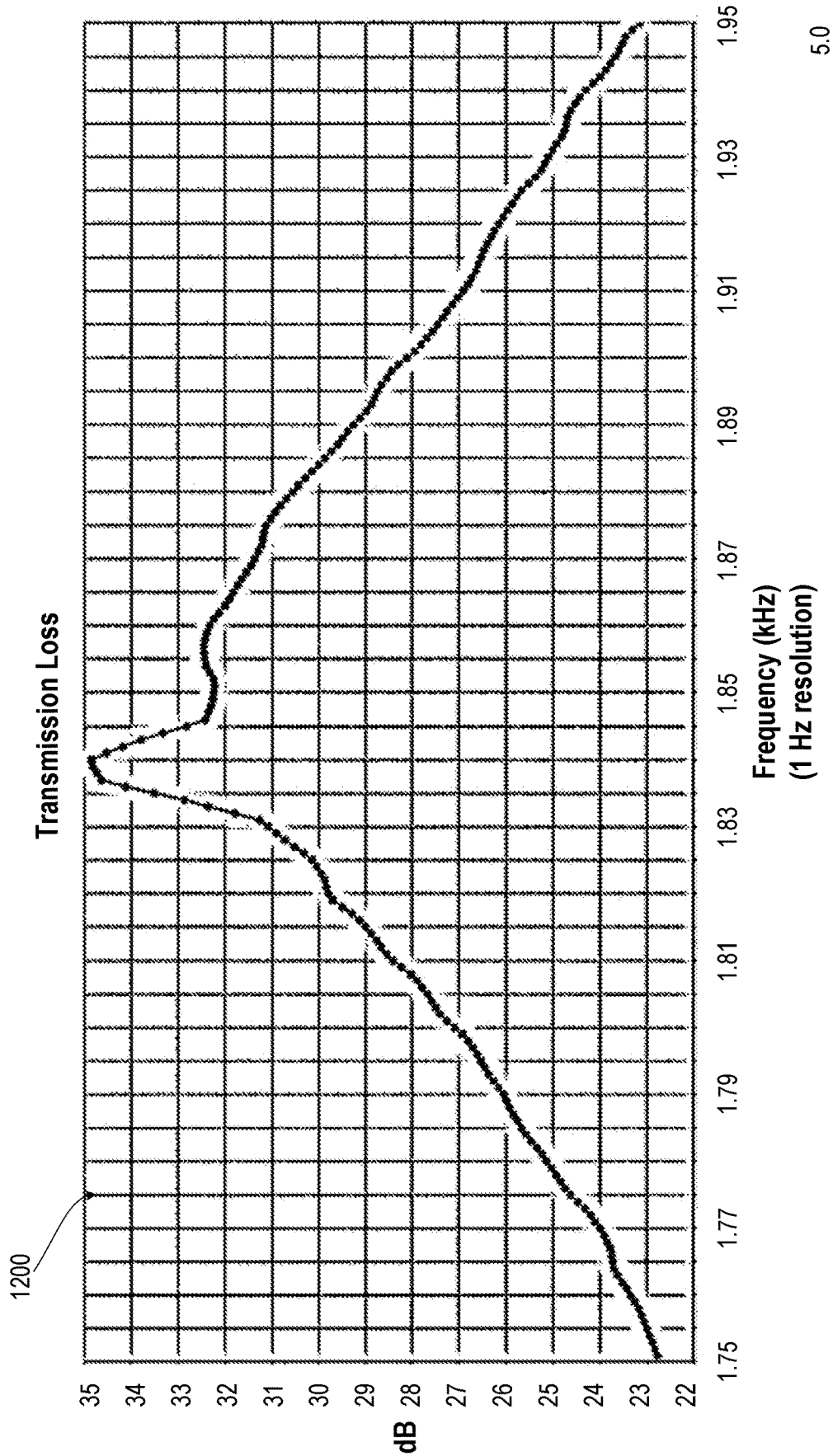
FIG. 12 is a detail view of the graphical plot of FIG. 11, according to one or more embodiments.

FIGS. 9-12 summarize the simulation results for acoustic resonator 800 (FIG. 8). FIG. 9 is a graphical plot representation 900 of acoustical performance with only an acoustic resonator and no foam. The acoustic effects were simulated with a model of a duct and acoustic resonator and plane wave originating at a fan plane. Measurements with real fans verified that the behavior of the resonator is in accordance with the simulation. Sample design point was targeted to 100% fan speed blade pass frequency of a typical enterprise fan module (2U Delta HPR fan). Transmission loss (measured in dB) is plotted as a function of frequency up to 5.2 kHz. FIG. 10 is a detail view of transmission loss plot 1000 of the maximum TL of FIG. 9. Maximum TL=32 dB occurs at 1815 Hz with an acoustic excitation that mimics a blade passage frequency of 1808 Hz. FIG. 11 is a graphical plot representation 1100 of acoustical performance with the acoustic resonator with 1 inch of CONFOR CF-40AC dampening material. Transmission loss (dB) is plotted as a function of frequency up to 5 kHz. Maximum TL=28 dB also occurs at 1815 Hz with an excitation of blade passage frequency of 1808 Hz. FIG. 12 is a detail view 1200 of the maximum TL of FIG. 11. Airflow performance was also simulated for a baseline airflow with no acoustic resonator, which provided 57 cubic feet per minute (CFM) of airflow. Airflow performance with acoustic resonator was 54 CFM for a 5% loss. Acoustic simulations indicate a maximum TL of around 35 dB at the blade passage frequency with an airflow penalty obtained through CFD calculations of 3%. Acoustic resonator 114 can be tuned to greatly reduce acoustic energy at one or two narrow frequency bands, with moderate reduction over a broad spectrum.

Figure 13A:
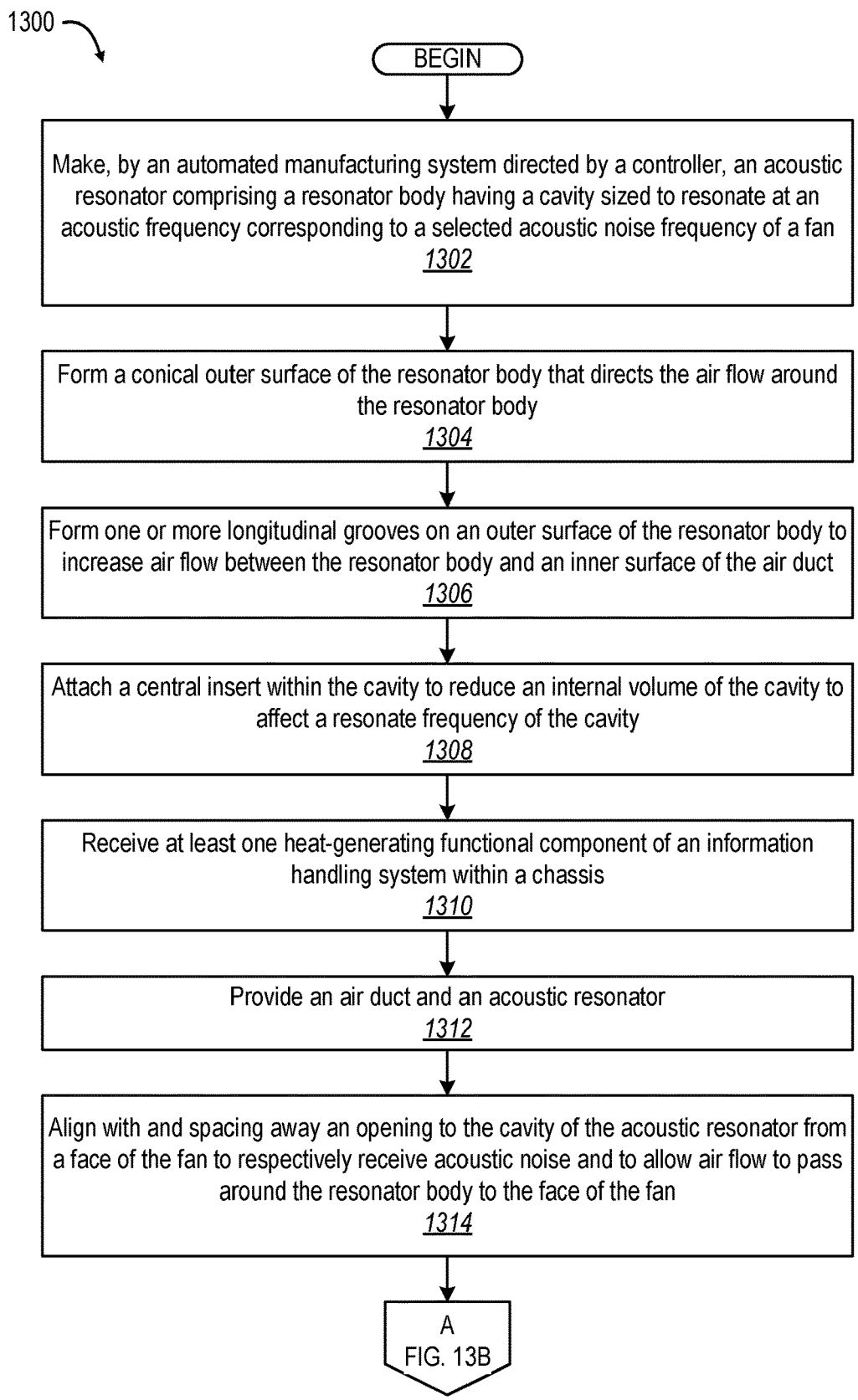
FIGS. 13A-B are a flow diagram of a method of making an IHS having internal acoustic attenuation of aeroacoustic noise from a fan, according to one or more embodiments.
Figure 13B:
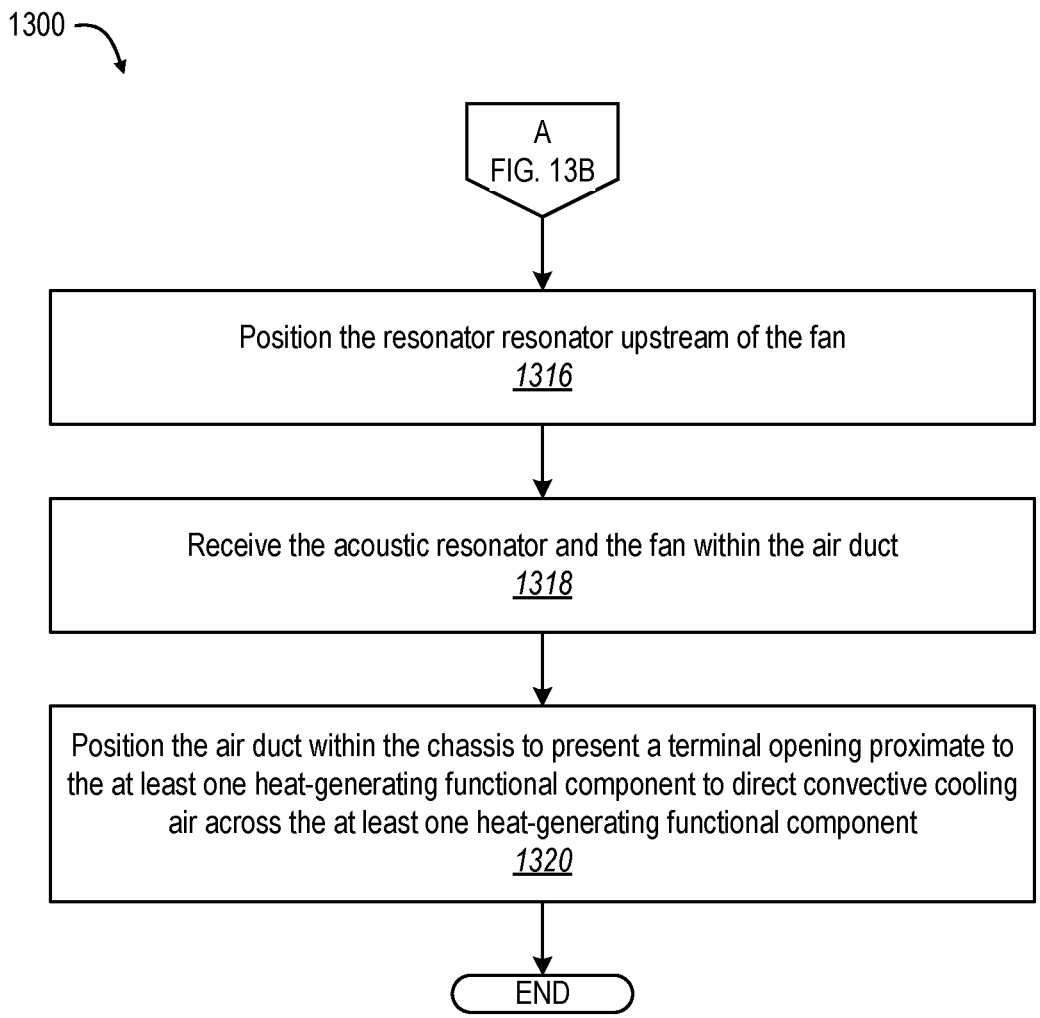

FIGS. 13A-B are a flow diagram illustrating a method 1300 of manufacturing an IHS having internal acoustic attenuation of aeroacoustic noise from a fan. With particular reference to FIG. 13A, method 1300 includes making, by an automated manufacturing system 174 (FIG. 1), an acoustic resonator comprising a resonator body having a cavity sized to resonate at an acoustic frequency corresponding to a selected acoustic noise frequency of a fan (block 1302). In one or more embodiments, method 1300 includes forming a conical outer surface of the resonator body that directs the air flow around the resonator body (block 1304). Method 1300 includes forming one or more longitudinal grooves on an outer surface of the resonator body to increase air flow between the resonator body and an inner surface of the air duct (block 1306). Method 1300 includes attaching a central insert, such as central insert 702 (FIG. 7) within the cavity to reduce an internal volume of the cavity to affect a resonate frequency of the cavity (block 1308).

Method 1300 includes receiving at least one heat-generating functional component of an IHS within a chassis (block 1310). Method 1300 includes providing an air duct and an acoustic resonator (block 1312). In one or more embodiments, the air duct and the acoustic resonator are automatically recalled from an inventory storage system to an automated manufacturing system. Method 1300 includes aligning with and spacing away an opening to the cavity of the acoustic resonator from a face of the fan to respectively receive acoustic noise and to allow air flow to pass around the resonator body to the face of fan (block 1314).

With particular reference to FIG. 13B, method 1300 includes positioning the resonator upstream of the fan (block 1316). Method 1300 includes receiving the acoustic resonator and the fan within the air duct (block 1318). Method 1300 includes positioning the air duct within the chassis to present a terminal opening proximate to the at least one heat-generating functional component to direct convective cooling air across the at least one heat-generating functional component (block 1320). Then method 1300 ends.

In the above described flow charts of FIG. 13 one or more of the methods may be embodied in an automated manufacturing system 174 (FIG. 1) that performs a series of functional processes. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

One or more of the embodiments of the disclosure described can be implemented, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

While the disclosure has been described with reference to exemplary embodiments, it will be understood by those skilled in the art that various changes may be made, and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprise" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. An air-cooled enclosure comprising:
a chassis that receives at least one heat-generating functional component of an information handling system, the chassis having an air duct;
a fan positioned at one end of the air duct within the chassis to move air within the chassis to convectively cool the at least one heat-generating functional component, the air duct positioned to direct cooling air flow between the fan and the at least one heat-generating functional component; and
an acoustic resonator positioned on an upstream side of the fan within the air duct and comprising a conical resonator body having a cavity, internal to the resonator body, sized to resonate at an acoustic frequency corresponding to a selected acoustic noise frequency associated with the fan, an opening to the cavity directed toward and positioned a distance from the fan to receive and attenuate acoustic noise, the cavity having a transverse area that is related to resonance frequency, the acoustic resonator tuned so that a resonant frequency is as close as possible to a blade pass frequency of the fan for high-speed operation.

2. The air-cooled enclosure of claim 1,
the acoustic resonator received within the air duct upstream of the fan, the air duct sized to allow air flow around an outer surface of the resonator body of the acoustic resonator and to prevent creation of acoustic resonances and avoid restricting the air flow, the air duct having a terminal opening positioned proximate to the at least one heat-generating functional component to enable convective air cooling of the at least one heat-generating functional component.

3. The air-cooled enclosure of claim 2, wherein the resonator body comprises a conical outer surface that directs the air flow around the outer surface of the resonator body with a top closed end of the conical outer surface positioned upstream away from the fan and a bottom open end of the conical outer surface closer to the fan module and blocking most of a cross-sectional area in front of the fan and a substantial portion of aero-acoustic energy is received within an expansive opening of acoustic resonator that is coextensive with a transverse area of the cavity.

4. The air-cooled enclosure of claim 1, wherein an outer surface of the resonator body comprises one or more longitudinal grooves that increase air flow between the resonator body and an inner surface of the air duct.

5. The air-cooled enclosure of claim 1, wherein the resonator body comprises a central insert positioned within the cavity to reduce an internal volume of the cavity and shaped to direct acoustic vibration between an exterior of the central insert and an interior surface of the cavity to affect a resonate frequency of the cavity.

6. The air-cooled enclosure of claim 1, the acoustic resonator further comprising one or more support structures extending from the resonator body and which attach the acoustic resonator to an upstream face of the fan, spaced away from the fan.

7. The air-cooled enclosure of claim 1, the acoustic resonator further comprising one or more support structures extending from the resonator body and which attach the acoustic resonator to the air duct.

8. An information handling system (IHS) comprising:
at least one heat-generating functional component; and
an air-cooled enclosure comprising:
a chassis that receives at least one heat-generating functional component of an information handling system, the chassis having an air duct;
a fan positioned at one end of the air duct within the chassis to move air within the chassis to convectively cool the at least one heat-generating functional component, the air duct positioned to direct cooling air flow between the fan and the at least one heat-generating functional component; and
an acoustic resonator positioned on an upstream side of the fan within the air duct and comprising a conical resonator body having a cavity, internal to the resonator body, sized to resonate at an acoustic frequency corresponding to a selected acoustic noise frequency associated with the fan, an opening to the cavity directed toward and positioned a distance from the fan to receive and attenuate acoustic noise, the cavity having a transverse area that is related to resonance frequency, the acoustic resonator tuned so that a resonant frequency is as close as possible to a blade pass frequency of the fan for high-speed operation.

9. The IHS of claim 8,
the acoustic resonator received within the air duct upstream of the fan, the air duct sized to allow air flow around an outer surface of the resonator body of the acoustic resonator and to prevent creation of acoustic resonances and avoid restricting the air flow, the air duct having a terminal opening positioned proximate to the at least one heat-generating functional component for convective air cooling of the at least one heat-generating functional component.

10. The IHS of claim 8, wherein an outer surface of the resonator body of the acoustic resonator comprises one or more longitudinal grooves that increase air flow between the resonator body and an inner surface of the air duct.

11. The IHS of claim 8, wherein the resonator body comprises a conical outer surface that directs the air flow around the outer surface of the resonator body with a top closed end of the conical outer surface positioned upstream away from the fan and a bottom open end of the conical outer surface closer to the fan module and blocking most of a cross-sectional area in front of the fan and a substantial portion of aero-acoustic energy is received within an expansive opening of acoustic resonator that is coextensive with a transverse area of the cavity.

12. The IHS of claim 8, wherein the resonator body comprises a central insert positioned within the cavity to reduce an internal volume of the cavity and shaped to direct acoustic vibration between an exterior of the central insert and an interior surface of the cavity to affect a resonate frequency of the cavity.

13. The IHS of claim 8, the acoustic resonator further comprising one or more support structures extending from the resonator body and which attach the acoustic resonator to an upstream face of the fan, spaced away from the fan.

14. The IHS of claim 8, the acoustic resonator further comprising one or more support structures extending from the resonator body and which attach the acoustic resonator to the air duct.

15. A method comprising:
making an acoustic resonator comprising a conical resonator body having a cavity, internal to the resonator body, sized to resonate at an acoustic frequency corresponding to a selected acoustic noise frequency of a fan to be used to cool at least one heat generating functional component, the cavity having a transverse area that is related to resonance frequency, the resonator body comprising a conical outer surface that direct air flow around an outer surface of the resonator body, the acoustic resonator sized to fit within an air duct provided within a chassis holding the at least one heat generating functional component, the air duct being positioned to direct cooling air flow between the fan and the at least one heat-generating functional component, the fan positioned at one end of the air duct to move air within the chassis to convectively cool the at least one heat-generating functional component;
forming one or more longitudinal grooves on an outer surface of the resonator body to increase air flow between the resonator body and an inner surface of the air duct;
providing one or more support structures extending from the resonator body to attach the acoustic resonator to at least one of an upstream face of the fan and the air duct; and
attaching a central insert within the cavity that reduces an internal volume of the cavity to affect a resonate frequency of the cavity;
wherein the acoustic resonator is designed to be positioned within the air duct upstream of the fan by aligning an opening to the cavity of the acoustic resonator a distance away from a face of the fan to respectively receive acoustic noise and to allow air flow to pass around an outer surface of the resonator body within the air duct to the face of fan.

16. The method of claim 15, further comprising:
tuning the acoustic resonator so that a resonant frequency is as close as possible to a blade pass frequency of the fan for high-speed operation;
receiving at least one heat-generating functional component of an information handling system within a chassis;
providing an air duct within the chassis, the air duct positioned to direct cooling air flow between the fan and the at least one heat-generating functional component;

positioning the fan at one end of the air duct within the chassis to move air within the chassis to convectively cool the at least one heat-generating functional component; and positioning the acoustic resonator within the air duct upstream of the fan by aligning an opening to the cavity of the acoustic resonator spaced away from a face of the fan to respectively receive acoustic noise and to allow air flow to pass around an outer surface of the resonator body within the air duct to the face of fan.

17. The method of claim 16, further comprising:
positioning the air duct within the chassis to present a terminal opening proximate to the at least one heat-generating functional component to direct convective cooling air from the fan across the at least one heat-generating functional component.

18. The method of claim 16, wherein making the acoustic resonator comprises forming one or more longitudinal grooves on an outer surface of the resonator body to increase air flow between the resonator body and an inner surface of an air duct.

19. The method of claim 16, wherein making the acoustic resonator comprises attaching a central insert within the cavity that reduces an internal volume of the cavity to affect a resonate frequency of the cavity.

20. The method of claim 16, further comprising attaching the acoustic resonator to one of an upstream face of the fan and the air duct using one or more support structures extending from the resonator body, spaced away from the fan.

\* \* \* \* \*